United States Patent [19]

Kinoshita

[11] Patent Number: 5,258,725
[45] Date of Patent: Nov. 2, 1993

[54] PHASE LOCK LOOP WITH COMPENSATION FOR VOLTAGE OR TEMPERATURE CHANGES IN A PHASE COMPARATOR

[75] Inventor: Osamu Kinoshita, Kawasaki, Japan

[73] Assignee: Kabushiki Kaisha Toshiba, Kawasaki, Japan

[21] Appl. No.: 847,108

[22] PCT Filed: Oct. 4, 1991

[86] PCT No.: PCT/JP91/01348
§ 371 Date: Apr. 14, 1992
§ 102(e) Date: Apr. 14, 1992

[30] Foreign Application Priority Data

Oct. 4, 1990 [JP] Japan .................. 2-264996

[51] Int. Cl.⁵ .................. H03L 7/093; H04L 7/02
[52] U.S. Cl. .................................. 331/17; 331/25
[58] Field of Search .............. 331/1 A, 17, 25, 27

[56] References Cited

U.S. PATENT DOCUMENTS 5,057,705 10/1991 Uchikoshi .................. 331/17 X

FOREIGN PATENT DOCUMENTS 56-15133 2/1981 Japan .
59-129228 7/1984 Japan .
61-143341 9/1986 Japan .
62-24736 2/1987 Japan .

Primary Examiner—Siegfried H. Grimm
Attorney, Agent, or Firm—Cushman, Darby & Cushman

[57] ABSTRACT

The present invention designs that the output of a phase comparator (102) is applied to one of the input terminals of a differential amplifier (106) through a low-pass filter (104), and an error detecting section (105) detects a change in the output of the phase comparator (102) due to a change in source voltage and temperature and applies that output change to the other input terminal of the differential amplifier (106) to cancel it out, so that the control voltage of a voltage controlled oscillator (107) is accurately expressed only by a phase difference output acquired by the phase comparator (102).

8 Claims, 7 Drawing Sheets

PHASE LOCK LOOP WITH COMPENSATION FOR VOLTAGE OR TEMPERATURE CHANGES IN A PHASE COMPARATOR

TECHNICAL FIELD

The present invention relates to a phase lock loop circuit, and more particularly, to a phase lock loop circuit which suppresses jitter of a clock to be obtained from the phase lock loop circuit, and phase-locks that clock, so that the clock can follow up an externally input clock at high accuracy.

BACKGROUND ART

Phase lock loop circuits have been used in various electronic circuits. Here, a description will be given on a phase lock loop circuit which is used in the destuffing section of a PCM multiplexing/separating apparatus.

There is a stuffing synchronization system as a method for multiplexing data of multiple channels which are asynchronous. In this system, an extra pulse is inserted (stuffed) as needed into asynchronous data to increase the data speed before a multiplex operation and the channels are given a pseudo synchronous relation, and then the data is multiplexed to be transferred. A data-receiving side divides the multiplexed data channel by channel, and eliminates (destuffs) the extra pulse that a data-sending side has inserted to reproduce the original data. Since the reproduced data has data absent empty space from which the extra pulse has been removed, time dependent fluctuation (jitter) will occur in the flow of data. A jitter suppressor having a phase lock loop circuit is therefore provided in the destuffing section of the multiplexing/separating apparatus.

FIG. 1 exemplifies a destuffing section in a conventional multiplexing/separating apparatus.

Reference numeral "10" denotes a frequency divider which frequency-divides a received clock CKL. The frequency divider 10 starts frequency division when receiving an enable pulse ENA. The frequency-divided output is used as write address data for a memory 20 to store input data Din. The output of the most significant bit of the frequency divider 10 is sent to one of the input portions of a phase comparator 30.

The phase comparator 30 has the other input portion supplied with the output of the least significant bit of the frequency-divided output of a frequency divider 40, like the frequency divider 10. The frequency divider 40 frequency-divides the output from a voltage controlled oscillator (VCO) 70. The output of the frequency divider 40 is used as read address data for the memory 20.

Phase difference data from the phase comparator 30 is supplied to a low-pass filter (LPF) 50 to be smoothed, and after being amplified by an amplifier 60, it is then sent to the control terminal of the voltage controlled oscillator 70 to control an oscillation frequency.

The enable pulse ENA is sent from a timing generator (not shown) in the multiplexing/separating apparatus, in correspondence to valid data which is the received data excluding a frame sync pulse, a stuffing pulse, etc. The memory 20 is a dual port memory which can designate the write and read addresses, independently. The memory 20, like the frequency divider 10, is controlled in accordance with the enable pulse ENA, and only valid data in the received data is to be intermittently written in the memory 20.

In this destuffing section, the oscillation frequency from the voltage controlled oscillator 70 is so controlled as to provide the steady average of the phase differences between the write and read addresses of the memory 20. The data intermittently written in the memory 20 is read out through buffering as sequential data Dout which has an equal average speed, thereby suppressing the jitter.

The phase locked loop of the above-described destuffing section includes the phase comparator 30 of a digital type since phase comparison inputs are digital signals. The phase comparator 30 of a digital type can be easily realized by an exclusive-OR circuit, a set/reset flip-flop circuit, etc. Since the phase comparison output includes analog information for controlling the frequency from the voltage controlled oscillator 70, however, it is necessary to stabilize the amplitude of a fanout with resect to changes in temperature and voltage. In other words, a change in the amplitude of the fanout from the phase comparator varies the phase difference between the write and read addresses of the memory 20. Such a phase change is called a steady phase difference. Increasing that difference induces the overflow or underflow of the memory 20 and causes an error in data which is read out from the memory 20. The change in the amplitude of the fanout from the phase comparator also varies the central value of an oscillation frequency from the voltage controlled oscillator, and equivalently narrows the lock range of the phase locked loop. Some countermeasures should be taken to prevent these shortcomings. To prevent an increase in the steady phase difference and narrowing of the lock range, the gain of the amplifier 60 is raised to increase the loop gain of the phase locked loop. The increase in the loop gain however results in more jitters in reproduced clocks.

To stabilize the amplitude of the fanout of the phase comparator, therefore, the following measures have conventionally been taken: stabilizing the source voltage of the phase comparator by a local regulator, and constituting the phase comparator by logic elements showing a slight change in temperature.

FIG. 2 exemplifies the structure of an output stabilizer in the conventional phase comparator.

The outputs from the frequency dividers 10 and 40 are sent respectively to logic level converters 31 and 32 which convert a CMOS level (+0.3 to +4.4 V) into an emitter coupled logic (ECL) level (−1.6 to −1.0 V). The outputs of the logic level converters 31 and 32 are supplied to the phase comparator 30 constituted by an exclusive-OR circuit. Reference numeral "33" denotes a source IC (local regulator), which has a source output terminal grounded via a bypass capacitor 35 and supplies the source output to the phase comparator 30. The source output terminal is also connected to the output terminal of the phase comparator 30 through an emitter resistor (the emitter resistor of the ECL exclusive-OR circuit)

In this arrangement, the source voltage of the ECL exclusive-OR circuit is to be stabilized by the source IC 33.

If the phase comparator is constituted by the ECL exclusive-OR circuit, the fluctuation of the output amplitude is compensated for by the IC (e.g. ECL 100K series), and this phase comparator significantly improves a change in output level compared with a phase comparator constituted by a CMOS exclusive-OR circuit. The phase comparator, if designed to have a CMOS logical circuit structure, is considered equivalent to a complementary switch which opens and closes a power supply side and a ground (GND) side. A change in the inner resistance of the switch due to a change in the source voltage or a temperature change is likely to appear directly as a change in amplitude of the fanout.

The above-described phase comparator which has an ability to compensate for an output amplitude however requires the level conversion, thus complicating the circuit. Power consumption is increased because that phase comparator uses the ECL as a logic element. The phase comparator above is not therefore suitable in the case of integrating (gate-arraying) the destuffing section for its miniaturization and lower power consumption.

As explained above, in the conventional phase lock loop circuit, an oscillation frequency control voltage from the voltage controlled oscillator is influenced by a voltage or temperature change on a control voltage producing side, so the change in control voltage causes a phase difference between an input signal and an oscillation output. The above influence gives rise to a serious problem, particularly for the destuffing section in the multiplexing/separating apparatus, for which it is difficult to set a large loop gain in order to reduce the jitter in the reproduced clock. The use of a phase comparator with an ECL structure which can stabilize the fanout amplitude en route of the phase locked loop complicates the circuit structure, and is inadequate to decrease power consumption.

It is therefore an object of the present invention to provide a phase lock loop circuit with low power consumption and a simple structure, which can stabilize the output of a phase comparator, and can provide a phase-locked signal that follows up an input signal at high accuracy.

DISCLOSURE OF THE INVENTION

A phase lock loop circuit according to the present invention comprises a voltage controlled oscillator; a first frequency divider for frequency-dividing an output of the voltage controlled oscillator; a phase comparator for detecting a phase difference between a frequency-divided output of the first frequency divider and an input signal; a first low-pass filter for smoothing an output of the phase comparator; a differential amplifier for receiving an output of the low-pass filter at one input terminal; error detecting means for supplying at least a change in a source voltage in the phase comparator to the other input terminal of the differential amplifier; and differential output supplying means for supplying a differential output from the differential amplifier to a control terminal of the voltage controlled oscillator.

According to this invention, the differential output supplying means sends a change in the output of the phase comparator, which is caused by a change in the source voltage or the temperature, to one of the input terminals of the differential amplifier, and the error detecting means detects the change in the output and sends it to the other terminal of the differential amplifier to cancel out that output change from the output of the differential amplifier, so that the control voltage of the voltage controlled oscillator is accurately expressed only by the phase difference acquired by the phase comparator.

BEST MODES OF CARRYING OUT THE INVENTION

Preferred embodiments of the present invention will now be described referring to the accompanying drawings.

Figure 1:
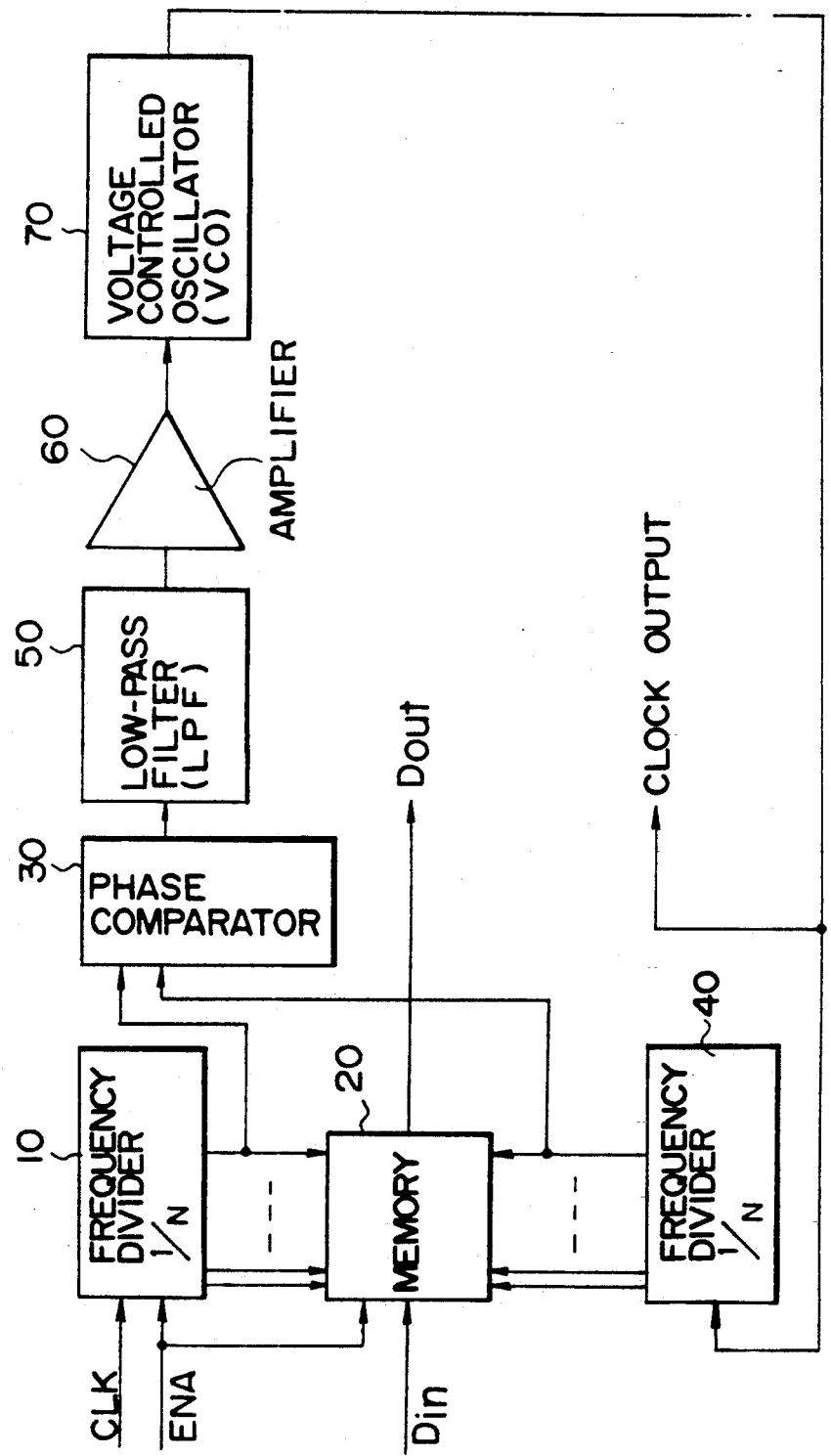
FIG. 1 is an explanatory diagram illustrating a conventional phase lock loop circuit.
Figure 2:
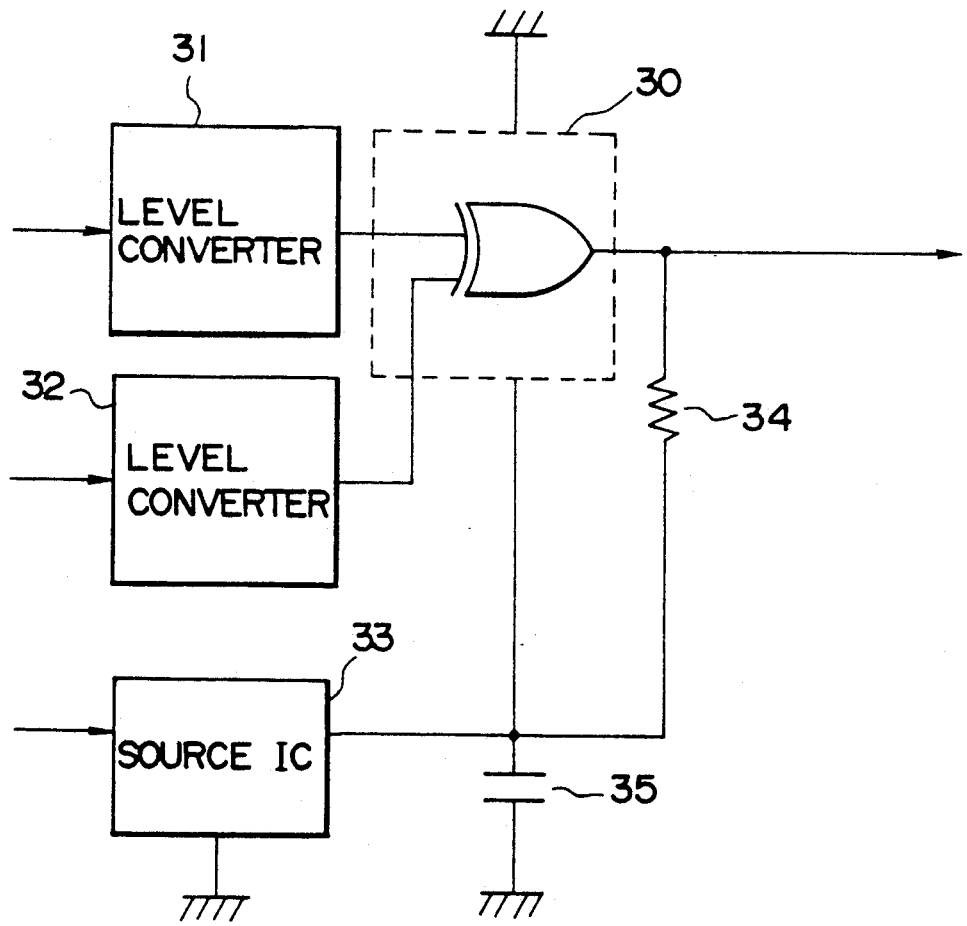
FIG. 2 is a diagram exemplifying the structure of a phase comparator shown in FIG. 1.
Figure 3:
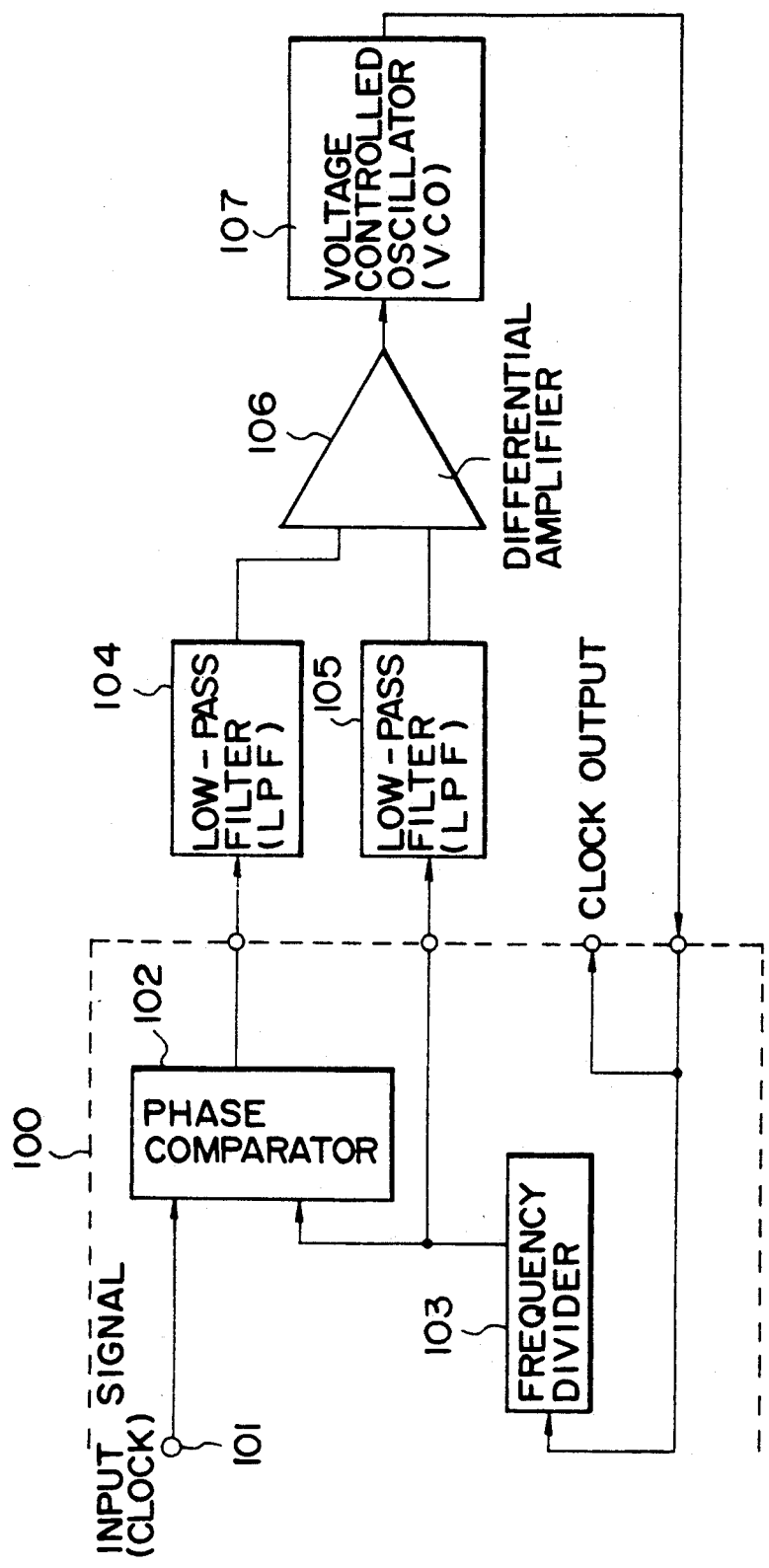
FIG. 3 is a circuit diagram illustrating one embodiment of the present invention.

FIG. 3 illustrates one embodiment according to the present invention. An input signal to be phase-locked (e.g. a clock) is sent to an input terminal 101 and supplied to one of the input portions of a phase comparator 102. The other input portion of the phase comparator 102 is supplied with a frequency-divided output which is the oscillation output of a voltage controlled oscillator (VCO) 107 frequency-divided by a frequency divider 103. The phase comparator 102 in turn provides a phase difference between the input signal and the output of the frequency divider 103, and the phase difference is smoothed by a low-pass filter (LPF) 104.

The output of the frequency divider 10 is supplied to a low-pass filter 105 to be smoothed. The frequency-dividing ratio of the frequency divider 103 is set so that the oscillation frequency of the voltage controlled oscillator 107 is equal to the frequency of the input signal.

The outputs of the low-pass filters 104 and 105 are supplied to the two input portions of a differential amplifier 106. The differential amplifier 106 then sends its differential output to the oscillation frequency control terminal of the voltage controlled oscillator 107. A block enclosed by a broken line 100 is designed as an integrated circuit. The phase comparator 102 is designed by, for example, an exclusive-OR circuit, and provides a pulse whose width is proportional to the phase difference between the input signal and the output of the frequency divider.

In this phase lock loop circuit, the output of the voltage controlled oscillator 107 is to be phase-locked with respect to the frequency of the input signal.

If the amplitude of the fanout from the phase comparator 102 varies due to a change in the source voltage or temperature, that amplitude change would appear as a similar change in the output of the frequency divider 103 (provided that the output stage of the phase comparator 102 and that of the frequency divider 103 have almost the same logic circuit structure). These changes are smoothed through the low-pass filters 104 and 105, respectively, and are sent to the differential amplifier 106. The above fluctuating component does not therefore appear in the output of the differential amplifier 106, so that the output of the voltage controlled oscillator 107 is not influenced by the change in the source voltage or temperature.

As described above, since the control voltage of the voltage controlled oscillator 107 is not affected by a change in the source voltage or temperature, the phase lock loop circuit provides an oscillation output which accurately follows up the phase of the input signal.

The present invention is not limited to the abovedescribed embodiment. In that embodiment, the change in output of the phase comparator due to fluctuation of the source voltage or the temperature is detected by error detecting means including the low-pass filter 105 which smooths the output of the frequency divider 103. Various embodiments are possible for the error detecting means.

Figure 4:
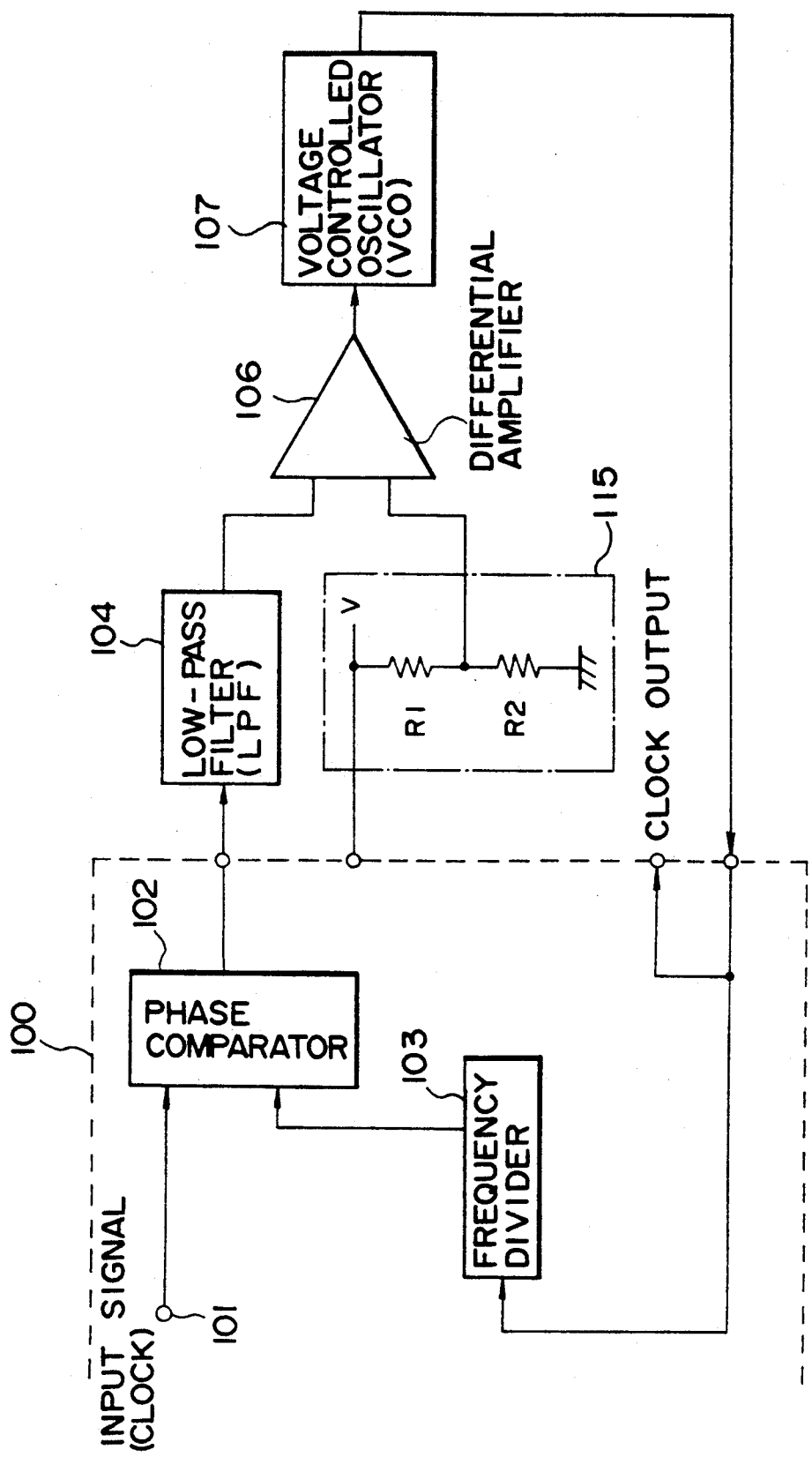
FIG. 4 is a circuit diagram showing another embodiment of the present invention.

FIG. 4 illustrates another embodiment of the present invention.

This embodiment is different from the aforementioned embodiment in that an error detector 115 is designed to have a source voltage V divided by resistors R1 and R2. Since the other portions in this embodiment are the same as those in the above-described embodiment, the same reference numerals as used in FIG. 3 are used to denote them.

In this embodiment too, a change in the source voltage in an integrated circuit is sent to one of the input terminals of a differential amplifier 106, so that the output of a comparator 102 though affected by the voltage change can be canceled on the output side of the differential amplifier 106. It is to be noted that this embodiment produces a less canceling effect when the inner resistance of a logic element has fluctuated due to the change in temperature, etc. than the canceling effect as in the previous embodiment.

Figure 5:
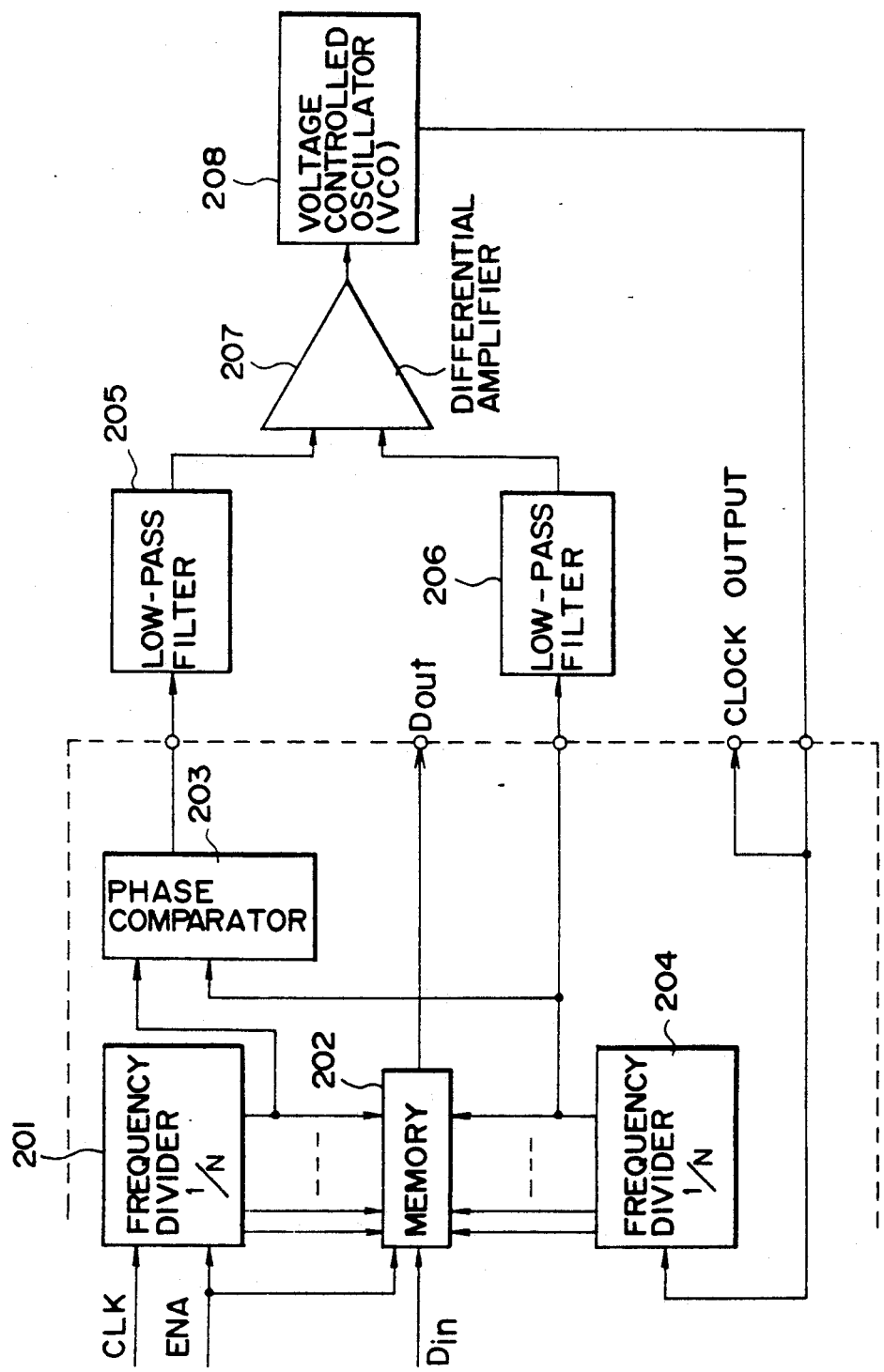
FIG. 5 is a circuit diagram illustrating an embodiment of the present invention as applied to a destuffing section in a multiplexing/separating apparatus.

FIG. 5 exemplifies the present invention as applied to the destuffing section of a multiplexing/separating apparatus.

Reference numeral "201" denotes a frequency divider which frequency-divides a received clock CKL. The frequency divider 10 starts frequency division when receiving an enable pulse ENA. The frequency-divided output is used as write address data for a memory 20 to store input data Din. The output of the most significant bit of the frequency divider 201 is sent to one of the input portions of a phase comparator 203.

The phase comparator 203 has the other input portion supplied with the frequency-divided output of the least significant bit of a frequency divider 204, like the frequency divider 201. The frequency divider 204 frequency-divides the output from a voltage controlled oscillator (VCO) 208. The output of the frequency divider 204 is used as read address data for the memory 202.

Phase difference data from the phase comparator 203 is supplied to a low-pass filter (LPF) 205 to be smoothed, and then sent to one of the input terminals of a differential amplifier 207. The output of the frequency divider 204 smoothed by a low-pass filter 206 is sent to the other input terminal of the differential amplifier 207. The output acquired in the amplifier 207 is sent to the control terminal of the voltage controlled oscillator 208 to control an oscillation frequency.

The enable pulse ENA is sent from a timing generator (not shown) in the multiplexing/separating apparatus, in correspondence to valid data which is the received data excluding a frame sync pulse, a stuffing pulse, etc. The memory 202 is a dual port memory which can designate the write and read addresses, independently. The memory 202, like the frequency divider 201, is controlled in accordance with the enable pulse ENA, and only valid data in the received data is to be intermittently written in the memory 202.

In this destuffing section, the oscillation frequency from the voltage controlled oscillator 208 is so controlled as to provide the steady average of the phase differences between the write and read addresses of the memory 202. The data intermittently written in the memory 202 is read out through buffering as sequential data Dout which has an equal average speed, thereby suppressing the jitter.

Figure 6:
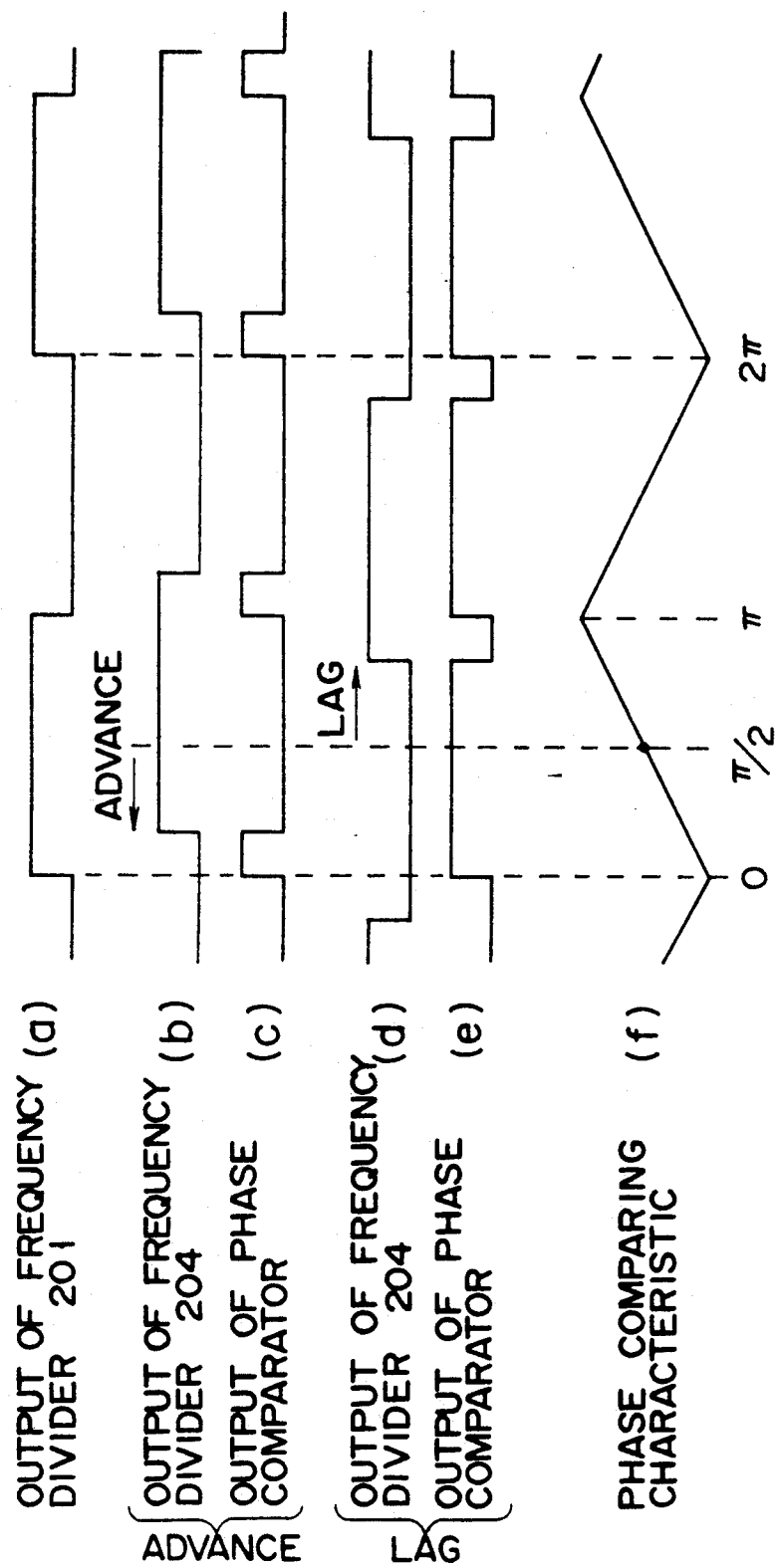
FIG. 6 is an operational waveform diagram for explaining the operation of the circuit shown in FIG. 5.

FIG. 6 presents an operational waveform diagram for explaining the operation of the above phase lock loop circuit.

In this diagram, (a) shows the output of the frequency divider 201. In this diagram, (b) shows that the output of the frequency divider 204 is advanced with respect to the $\pi/2$ phase of the output of that frequency divider. In this case the phase comparator 203 provides a phase difference output as shown in (c) in FIG. 6. When the frequency-divided output of the frequency divider 204 lags behind as shown in (d) in FIG. 6, on the other hand, the phase comparator 203 provides a phase difference output as shown in (e) in the same diagram.

As described above, when the outputs of the frequency dividers 201 and 204 have the normal phase relationship (have a phase difference of $\pi/2$), the phase difference output from the phase comparator 203 is so set as to be a pulse with a duty of 50%. This is possible by adjusting the free-running frequency of the voltage controlled oscillator 208. As the phase of the frequency-divided output of the frequency divider 204 advances, the width of the output pulse from the phase comparator 203 becomes narrower, while as the phase lags, the pulse width becomes wider. The phase comparison characteristic can therefore be expressed as shown in FIG. 6 (f), and the output characteristic of the low-pass filter 205 becomes similar to the former characteristic.

When the output voltage of the low-pass filter 205 rises, the oscillation frequency of the voltage controlled oscillator 208 is controlled to be lower (controlled to lag the phase). When the output voltage of the low-pass filter 205 falls, on the other hand, the oscillation frequency of the voltage controlled oscillator 208 is controlled to be higher (controlled to advance the phase).

When the frequency-divided output of the frequency divider 204 is controlled to lag behind the frequency-divided output of the frequency divider 201, which means that the write address of the memory 202 is delayed from the read address, intermittently arriving received data is buffered by the memory and is read out at a constant speed. The negative inclined portion of the phase comparison characteristic has a different polarity, it does not provide a stable point of the phase locked loop and will be skipped. It is therefore possible to automatically avoid an underflow state where the read address of the memory 202 passes the write address.

When source voltage varies, changing the fanout output level of the phase comparator 203, the output of the low-pass filter 205 naturally varies too. This change will occur even when the frequency dividers 201 and 204 have no phase difference, and will vary the oscillation frequency of the voltage controlled oscillator 208. This variation is however eliminated in the following manner in this embodiment.

The 1/N frequency-divided output of the frequency divider 204 is acquired by frequency-dividing a clock produced by the voltage controlled oscillator 208, and this frequency divider always outputs a pulse with a duty of 50%. The signal smoothed by the low-pass filter 206 has a voltage level approximately equal to that of the signal smoothed by the low-pass filter 205. Since a change in the amplitude of the fanout due to a variation in the source voltage occurs mainly at the output stage of the logic element, the amount of a change in the output of the low-pass filter 205 becomes equal to the amount of a change in the output of the low-pass filter 206 provided that the output circuit of the phase comparator 203 and the output circuit of the 1/N output of the frequency divider 204 are constituted by an identical circuit. The in-phase eliminating function of the differential amplifier 207 can therefore suppress the aforementioned change in voltage level.

In the case where the output (most significant bit) of the frequency divider 204 is led to the low-pass filter 206 in the above-described circuit, what is supplied is a bit output (most significant bit) corresponding to the bit of the frequency divider 201. But, this is not restrictive. Particularly, since the repetitive frequency of the phase comparator 203 is approximately twice the frequency of the signal that is applied to the input terminal, a change in the average level originating from the difference between the rise time and fall time of the logic element can be suppressed, thus providing a more accurate compensation loop, if a signal having twice as high a frequency as that of the signal to be supplied to the phase comparator 203 is used as the signal to be supplied as a reference signal to the low-pass filter 206 from the frequency divider 204. Accordingly, a signal of bit 2 (n−1) less significant by one than the most significant bit 2 n may be utilized as the signal to be supplied to the low-pass filter 206 from the frequency divider 204.

Figure 7:
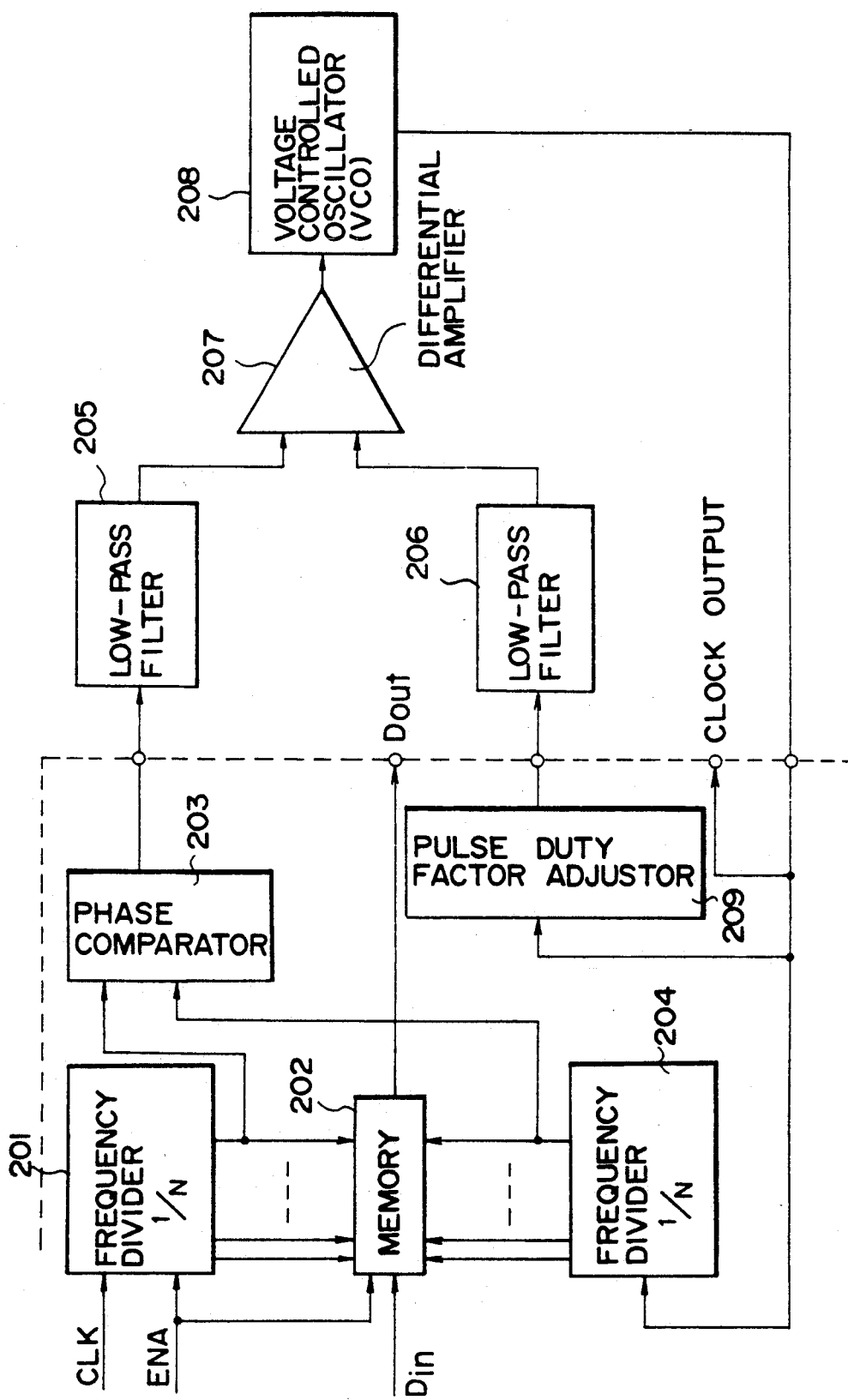
FIG. 7 is a diagram illustrating a further embodiment of the present invention.

FIG. 7 illustrates another embodiment of this invention. The difference from the embodiment shown in FIG. 5 lies in that the error detecting section comprises a pulse duty factor adjuster 209 and a low-pass filter 206; as the other portions are the same as those of the embodiment in FIG. 5, they are given the same reference numerals.

While the description of the embodiment in FIG. 5 has been given with reference to the case where the output of the phase comparator with the phase locked loop in the normal state has a pulse waveform with a duty of 50%, the duty can be set arbitrarily in the embodiment shown in FIG. 7.

For instance, when the duty of the output pulse of the phase comparator 203 is 33%, the pulse duty factor adjuster 209 is designed to have a ⅓ frequency dividing cycle, so that the output of the voltage controlled oscillator 208 is frequency-divided to be output as a pulse waveform with a duty of 33%. This output waveform is smoothed by the low-pass filter 206 before being input to the differential amplifier 207.

With such a structure, if the duty of the output of the pulse duty factor adjuster 209 is made equal to the duty of the output pulse of the phase comparator 203, a variation in the amplitude of the fanout of the phase comparator 203 can be suppressed even when the set duty differs from 50%.

Although a change in the set output duty of the phase comparator 203 can be coped with by varying the ratio of the resistance of R1 to that of R2 in the embodiment shown in FIG. 4, this embodiment in FIG. 4 cannot cancel out a change in the amplitude of the fanout originating from a temperature change. The embodiment in FIG. 7 can cancel a variation in the amplitude of the fanout of the phase comparator due to both a change in the source voltage and a temperature change.

The above-described embodiments take a simple structure to frequency-divide and smooth the output clock of the voltage controlled oscillator and use the smoothed signal as a reference signal for suppressing a change in the amplitude of a fanout. The embodiments do not therefore need an extra logic circuit or a level converter, and hardly have an increase in power consumption, so that they are suitable to be designed into an LSI circuit.

The embodiments shown in FIGS. 3, 5 and 7 can suppress not only a change in the source voltage which changes the amplitude of the fanout of the phase comparator, but also a change in the average level originating from the temperature-dependent change of the internal resistance of the logic element or the difference between the rise and fall time of the output pulse, thus ensuring highly accurate phase locking.

Industrial Applicability

As described above, the phase lock loop circuit according to this invention has low power consumption and a simple structure, can stabilize the output of a phase comparator, and can provide a phase-locked signal that follows up an input signal at high accuracy. It is therefore possible to realize a phase lock loop circuit suitable for use in various electronic circuits, such as a destuffing section of a PCM multiplexing/separating apparatus.

What is claimed is:

1. A phase lock loop circuit comprising:
    a voltage controlled oscillator;
    a first frequency divider for frequency-dividing an output of said voltage controlled oscillator;
    a phase comparator for detecting a phase difference between a frequency-divided output of said first frequency divider and an input signal;
    a first low-pass filter for smoothing an output of said phase comparator;
    a differential amplifier for receiving an output of said low-pass filter at one input terminal;
    error detecting means for supplying at least a change in a source voltage in said phase comparator to the other input terminal of said differential amplifier; and
    differential output supplying means for supplying a differential output from said differential amplifier to a control terminal of said voltage controlled oscillator.

2. A phase lock loop circuit according to claim 1, wherein said error detecting means is a resistance element which voltage-divides said source voltage.

3. A phase lock loop circuit according to claim 1, wherein said error detecting means is a second low-pass filter for smoothing said frequency-divided output of said first frequency divider.

4. A phase lock loop circuit according to claim 3, wherein a signal to be supplied to said low-pass filter is either an output of the most significant bit or that of the least significant bit of said frequency-divided output of said first frequency divider.

5. A phase lock loop circuit according to claim 1, wherein said input signal to be input to said phase comparator is led through a second frequency divider, whose frequency-dividing ratio is the same as that of said first frequency divider.

6. A phase lock loop circuit according to claim 5, wherein a frequency-divided output of said second frequency divider is used as a write address for a memory to store input data, and said frequency-divided output of said first frequency divider is used as a read address for said memory.

7. A phase lock loop circuit according to claim 1, wherein said error detecting means comprises a pulse duty factor adjuster and a low-pass filter.

8. A phase lock loop circuit according to claim 7, wherein said pulse duty factor adjuster is controlled to make a duty of an output waveform equal to a duty of an output waveform of said phase comparator.

* * * * *